United States Patent [19]

Kubo

[11] Patent Number: 5,362,995

[45] Date of Patent: Nov. 8, 1994

[54] VOLTAGE COMPARING CIRCUIT

[75] Inventor: Satoru Kubo, Tokyo, Japan

[73] Assignee: NEC Corporation, Tokyo, Japan

[21] Appl. No.: 56,508

[22] Filed: May 3, 1993

[30] Foreign Application Priority Data

May 12, 1992 [JP] Japan .................. 4-118662

[51] Int. Cl.$^5$ .................. H03K 5/24; H03K 17/16
[52] U.S. Cl. .................. 327/65; 327/63; 327/387
[58] Field of Search ............ 307/572, 494, 497, 542, 307/290, 355, 249, 443, 263, 495, 246, 573, 496

[56] References Cited

U.S. PATENT DOCUMENTS

| | | | |
|---|---|---|---|
| 4,965,468 | 10/1990 | Nicollini et al. | 307/494 |
| 5,196,737 | 3/1993 | Olmstead | 307/355 |
| 5,223,753 | 6/1993 | Lee et al. | 307/494 |
| 5,289,058 | 2/1994 | Okamoto | 307/355 |
| 5,311,071 | 5/1994 | Ueda | 307/355 |

*Primary Examiner*—Timothy P. Callahan
*Assistant Examiner*—My-Trang Nu Ton
*Attorney, Agent, or Firm*—Whitham, Curtis, Whitham & McGinn

[57] ABSTRACT

A voltage comparing circuit has a current pass forming circuit connecting the one main terminals of a first and second field effect transistors which input two input signal voltages on their control terminals, respectively. The current pass forming circuit, respond to the voltage difference between the two input signals, forms an instantaneous current pass between the one main terminals of the first and second transistors to cancel out the charging and discharging current of the associated transistors.

8 Claims, 7 Drawing Sheets

VOLTAGE COMPARING CIRCUIT

FIELD OF THE INVENTION

The present invention relates to a semiconductor integrated circuit and, in particular, to an improvement of a voltage comparing circuit for comparing two input voltages to output the result corresponding to the voltage difference between the two inputs.

BACKGROUND OF THE INVENTION

A conventional voltage comparing circuit is shown in FIG. 1. Two input voltages, $V_{i+}$ and $V_{i-}$, are applied on a non-inverting input terminal 5 and an inverting input terminal 4, respectively. An output voltage Vo appears on an output terminal 2, the voltage Vo corresponding to the difference between the input voltages, $V_{i+}$ and $V_{i-}$.

Referring to FIG. 1, the voltage comparing circuit is mainly comprised of a differential amplifier, a level shift circuit, and an output circuit, the differential amplifier comprising p-channel Metal-Oxide-Semiconductor (MOS) transistors $M_3$–$M_6$ and n-channel MOS transistors $M_{12}$–$M_{14}$, the level shift circuit comprising p-channel MOS transistors $M_7$ and $M_8$ and n-channel MOS transistors $M_{15}$ and $M_{16}$, and the output circuit comprising a p-channel MOS transistor $M_g$ and an n-channel MOS transistor $M_{17}$.

The input voltages $V_{i+}$ and $V_{i-}$ are input to the differential amplifier which amplifies their voltage difference. The two voltages having the amplified voltage difference are applied to the respective gates of the transistors $M_7$ and $M_8$ in the level shift circuit.

Given that the input voltage $V_{i-}$ is a specified reference voltage, when the input voltage $V_{i+}$ is less than the reference voltage $V_{i-}$, the drain voltage of the transistor $M_7$ is the threshold voltage $V_{th}$ of the transistor $M_{15}$ and the drain voltage of the transistor $M_8$ is the high voltage $V_{cc-h}$ on the high supply voltage terminal 1.

When the input voltage $V_{i+}$ increases in excess of the reference voltage $V_{i-}$, the gate voltages of the transistors $M_7$ and $M_8$ are inverted, so that the drain voltage of the transistor $M_7$ becomes the voltage $V_d$ voltage-divided by the on-state resistances of the transistors $M_7$ and $M_{15}$ and the drain voltage of the transistor $M_8$ becomes the low voltage $V_{cc-l}$ on the low supply voltage terminal 3. To sum up, the drain voltage of the transistor $M_7$ increases from $V_{th}$ to $V_d$, and the drain voltage of the transistor $M_8$ decreases from $V_{cc-h}$ to $V_{cc-l}$.

When such a voltage change occurs in the level shift circuit, however, charging or discharging current flows into or out of the gate capacitances and the drain and source diffusion capacitances of the transistors in the level shift circuit. This means that the drain voltage of the transistor $M_8$, that is, the output voltage of the level shift circuit does not increase or decrease until such a charge or discharge terminates. In other words, there is a delay time caused by the charge and discharge which passes between the input voltages changing and the corresponding output of the level shift circuit changing, resulting in delayed response time of the entire voltage comparing circuit.

This conventional circuit operation is simulated and its characteristics is shown in FIG. 2, where the reference input voltage $V_{i-}$ is 2.5 V, the waveform 21 indicates the input voltage $V_{i+}$ increasing from 2.41 V to 2.51 V, and the waveform 22 indicates the output voltage Vo appearing on the output terminal 2 in response to the input voltage $V_{i+}$.

SUMMARY OF THE INVENTION

A voltage comparing circuit according to the present invention has a current pass forming circuit connecting the one main terminals of a first and second field effect transistors which input two input signal voltages on their control terminals, respectively.

The current pass forming circuit, respond to the voltage difference between the two input signals, forms a current pass between the one main terminals of the first and second transistors to cancel out the charging and discharging current of the associated transistors.

The current pass forming circuit is comprised of a oneshot trigger pulse generator and a gate circuit. The trigger pulse generator outputs a oneshot trigger pulse to the gate circuit in response to a change of the voltage difference between the two input signal voltages. Receiving the trigger pulse, the gate circuit forms an instantaneous current pass.

Preferably, the gate circuit comprises a field effect transistor whose gate receives the oneshot trigger pulse. More preferably, the gate circuit comprises a bilateral gate whose control terminal receives the oneshot trigger pulse.

DETAILED DESCRIPTION OF THE PREFERRED EMBODIMENTS

Figure 3:
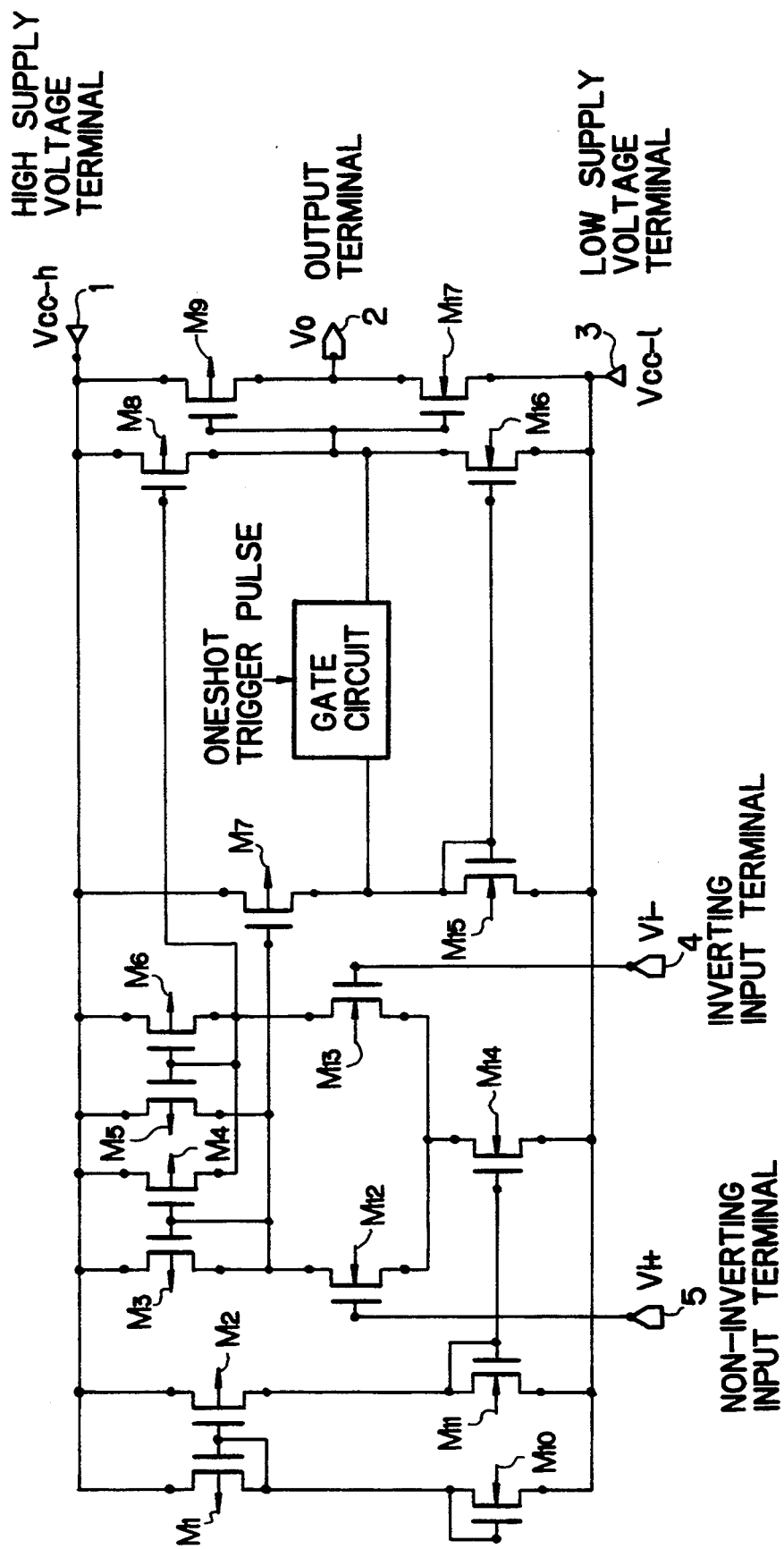
FIG. 3 is a schematic circuit diagram of a voltage comparing circuit according to the present invention.

Referring to FIG. 3, a voltage comparing circuit in accordance with the present invention has a high supply voltage terminal 1, an output terminal 2, a low supply voltage terminal 3, an inverting input terminal 4, and a non-inverting input terminal 5. Two input voltages, $V_{i+}$ and $V_{i-}$, are applied on the non-inverting and the inverting input terminals 5 and 4, respectively. An output voltage Vo appears on the output terminal 2, the output voltage Vo corresponding to the difference between the input voltages, $V_{i+}$ and $V_{i-}$.

The voltage comparing circuit is mainly comprised of a differential amplifier receiving the two input voltages, a level shift circuit including a gate circuit which is capable of providing a current pass according to a oneshot trigger pulse, and an output circuit providing the output of the level shift circuit to the output terminal 2.

The differential amplifier is comprised of p-channel MOS transistors $M_3$–$M_6$ and n-channel MOS transistors $M_{12}$–$M_{14}$. The two input voltages, $V_{i+}$ and $V_{i-}$, are applied on the gates of the transistors $M_{12}$ and $M_{13}$ through the non-inverting and the inverting input terminals 5 and 4, respectively.

The voltage difference between $V_{i+}$ and $V_{i-}$ is amplified by the differential amplifier. Its two output voltages with the amplified voltage difference are output from the drains of the transistors $M_3$ and $M_6$ to the gates of the transistors $M_7$ and $M_8$ in the level shift circuit, respectively.

The level shift circuit is comprised of p-channel MOS transistors $M_7$ and $M_8$, n-channel MOS transistors $M_{15}$ and $M_{16}$, the gate circuit, and a trigger pulse generator (not shown in FIG. 3).

The transistors $M_7$ and $M_{15}$ are connected in series. The transistor $M_7$ has its drain connected to the drain of the transistor $M_{15}$ and its source connected to the high supply voltage terminal 1. The transistor $M_{15}$ has its source connected to the low supply voltage terminal 3 and its gate connected to its drain as well as the gate of the transistor $M_{16}$.

Similarly, the transistors $M_8$ and $M_{16}$ are connected in series, the transistor $M_8$ having its drain connected to the drain of the transistor $M_{16}$ and its source connected to the high supply voltage terminal I and the transistor $M_{16}$ having its source connected to the low supply voltage terminal 3. The drain of the transistor $M_8$ serves as the output terminal of the level shift circuit.

The drains of the transistor $M_7$ and $M_8$ are connected with the gate circuit which is capable of forming a current pass between them according to a oneshot trigger pulse. This current pass forming circuit will be described in detail later.

The output circuit is comprised of p-channel MOS transistor $M_g$ and n-channel MOS transistor $M_{17}$. Their gates are connected in common to the drain of the transistor $M_8$ as the output terminal of the level shift circuit and their drains to the output terminal 2.

The operation of the voltage comparing circuit mentioned above will now be described. Assuming that the respective threshold voltages of p-channel and n-channel MOS transistors are $-0.8$ V and $0.8$ V, the high supply voltage $V_{cc-h}$ is 5 V, the input voltage $V_{i-}$ is the reference voltage of 2.5 V, and the non-inverting input terminal 5 receives a pulse of 0.1 $V_{p-p}$ comprising the initial low voltage of 2.41 V and the pulse high voltage of 2.51 V.

When the input voltage $V_{i+} = 2.41$ V is applied on the noninverting input terminal 5, the differential amplifier amplifies the voltage difference of the two input voltages, $V_{i+} = 2.41$ V and $V_{i-} = 2.5$ V, and outputs two voltages having the amplified difference from the drains of the transistors $M_3$ and $M_6$ to the gates of the transistors $M_7$ and $M_8$, respectively.

Thus, the threshold voltage $V_{th}$ of the transistor $M_{15}$ appears on the drain of the transistor $M_7$ that is in off-state, and the high supply voltage $V_{cc-h}$ appears on the drain of the transistor $M_8$ that is in on-state.

A 0.1 $V_{p-p}$ pulse is now applied to the non-inverting input terminal 5 whose voltage $V_{i+}$ rises from 2.41 V to 2.51 V in excess of the input voltage $V_{i-}$ of 2.5 V. This causes the relative polarity of the gate voltages of the transistors $M_7$ and $M_8$ to be inverted.

At this instance, a oneshot trigger pulse is generated and given to the gate circuit. This trigger pulse causes the gate circuit to form an instantaneous current pass between the drains of the transistors $M_7$ and $M_8$. The current pass cancels out the charging and discharging current on the drains of those transistors, resulting in more rapid operation that the drain voltage of the transistor $M_7$ increases from $V_{th}$ to $V_d$ and the drain voltage of the transistor $M_8$ decreases from $V_{cc-h}$ to $V_{cc-l}$.

CURRENT PASS FORMING CIRCUIT

Figure 4:
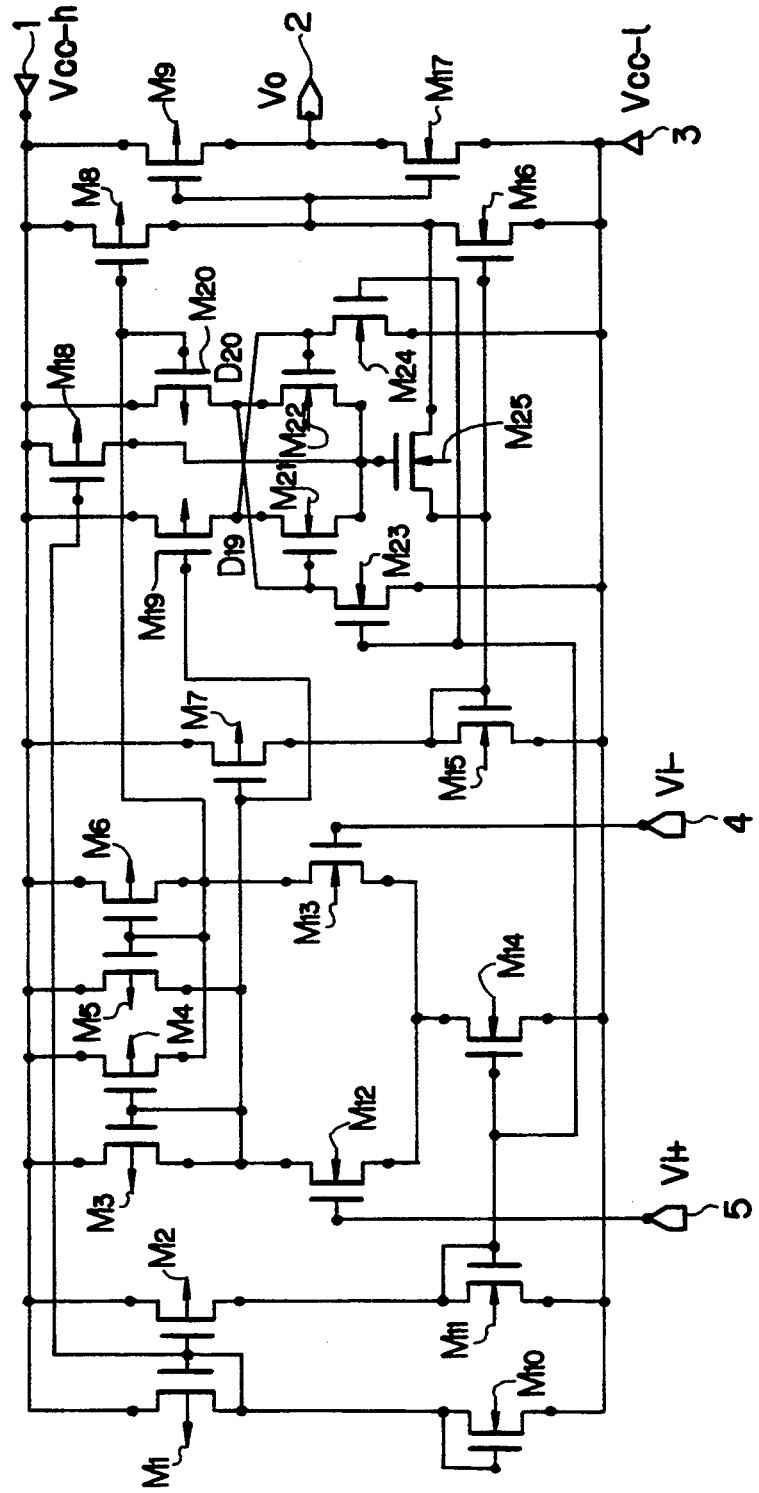
FIG. 4 is a circuit diagram of a first embodiment according to the present invention.

FIG. 4 shows details of a current pass forming circuit of the integrated circuit according to one embodiment of the present invention.

The current pass forming circuit is comprised of a oneshot trigger pulse generator and a gate circuit, the trigger pulse generator comprising p-channel MOS transistors $M_{18}$–$M_{20}$ and n-channel MOS transistors $M_{21}$–$M_{24}$, and the gate circuit comprising n-channel MOS transistor $M_{25}$ by which the drains of the transistors $M_7$ and $M_8$ are connected. The oneshot trigger pulse is applied on the gate of the transistor $M_{25}$ which forms the instantaneous current pass between the drains of the transistors $M_7$ and $M_8$.

The transistors $M_{19}$ and $M_{20}$ have their respective gates connected to the drains of the transistors $M_3$ and $M_6$ in the differential amplifier. The drains $D_{19}$ and $D_{20}$ of the transistors $M_{19}$ and $M_{20}$ are connected to the low supply voltage terminal 3 via the transistors $M_{24}$ and $M_{23}$, respectively. The drains $D_{19}$ and $D_{20}$ are also connected in common to the gate of the transistor $M_{25}$ via the transistors $M_{21}$ and $M_{22}$, respectively. The gate of the transistor $M_{21}$ is connected to the drain $D_{20}$ of the transistor $M_{20}$, and the gate of the transistor $M_{22}$ to the drain $D_{19}$ of the transistor $M_{19}$.

OPERATION OF THE CURRENT PASS FORMING CIRCUIT

Now assuming that the transistor $M_{19}$ is in on-state and the transistor $M_{20}$ in off-state by two output voltages of the differential amplifier.

On the drain $D_{19}$ of the transistor $M_{19}$ appears the voltage Vhi divided by the on-state resistances of the transistors $M_{19}$ and $M_{24}$ and on the drain $D_{20}$ of the transistor $M_{20}$ appears the low voltage $V_{low}$ equal to the low supply voltage $V_{cc-l}$. This means that the transistor $M_{21}$ is in off-state and the transistor $M_{22}$ in on-state, and the low voltage Vlow on the drain $D_{20}$ is applied on the gate of the transistor $M_{25}$. Thus, the transistor $M_{25}$ is in off-state, forming no current pass.

When the two output voltages from the differential amplifier are changed, the transistor $M_{20}$ turns out to be in on-state, therefore the transistor $M_{21}$ is also turned into on-state. This causes the voltage $V_{hi}$ on the drain $D_{19}$ to be applied on the gate of the transistor $M_{25}$ via the transistor $M_{21}$.

When the two output voltages from the differential amplifier are further changed, however, the voltage of the drain $D_{19}$ drops from $V_{hi}$ to $V_{low}$. Therefore, an instantaneous pulse is applied to the gate of the transistor $M_{25}$ only when the relative polarity of the two output voltages from the differential amplifier is changed.

Receiving the oneshot trigger pulse, the transistor $M_{25}$ turns out to be in on-state, forming an instantaneous current pass between the drains of the transistors $M_7$ and $M_8$. The current pass cancels out the charging and discharging current on the drains of those transistors, resulting in reduced response delay of the entire integrated circuit.

Figure 1:
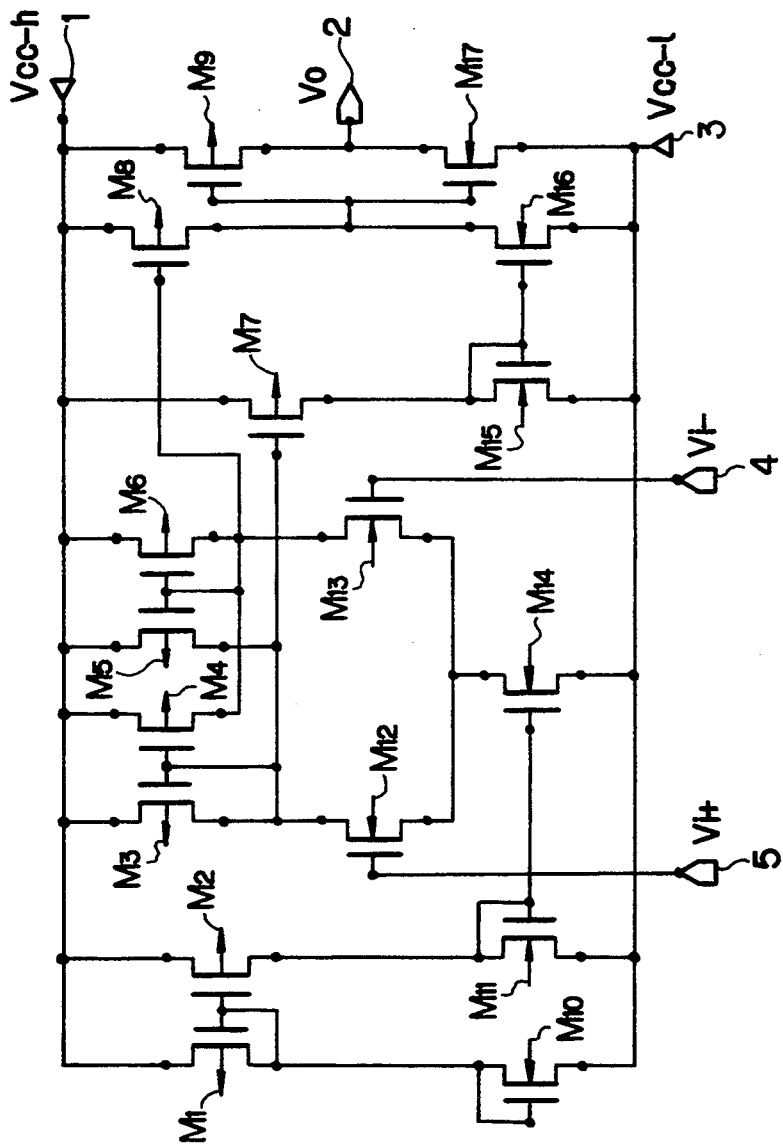
FIG. 1 is a diagram of a conventional voltage comparing circuit.
Figure 2:
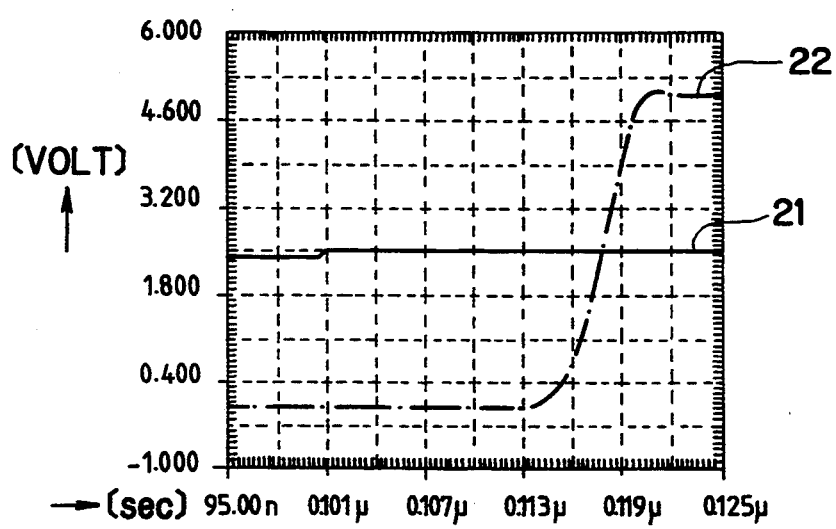
FIG. 2 is a graph of simulation waveforms illustrating the relationship between an input voltage and the corresponding output voltage in the conventional voltage comparing circuit.
Figure 7:
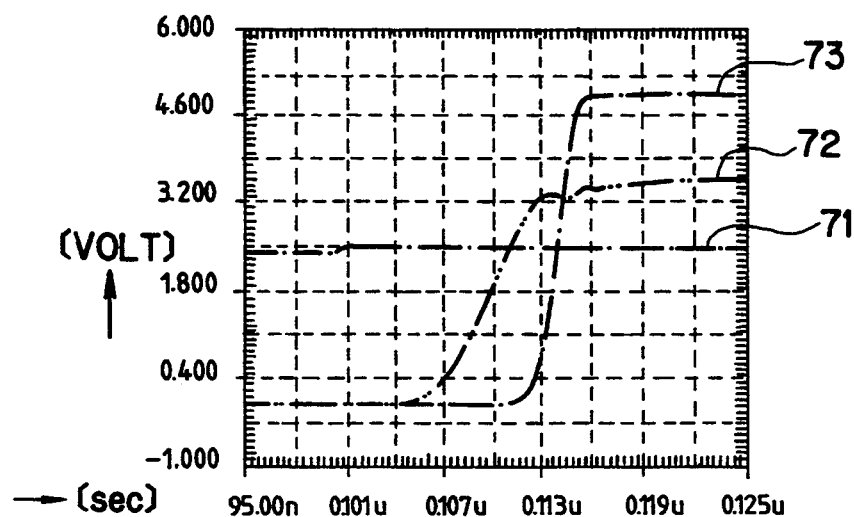
FIG. 7 is a graph of simulation waveforms illustrating the relationship between an input voltage and the corresponding output voltage in the first embodiment.
Figure 8:
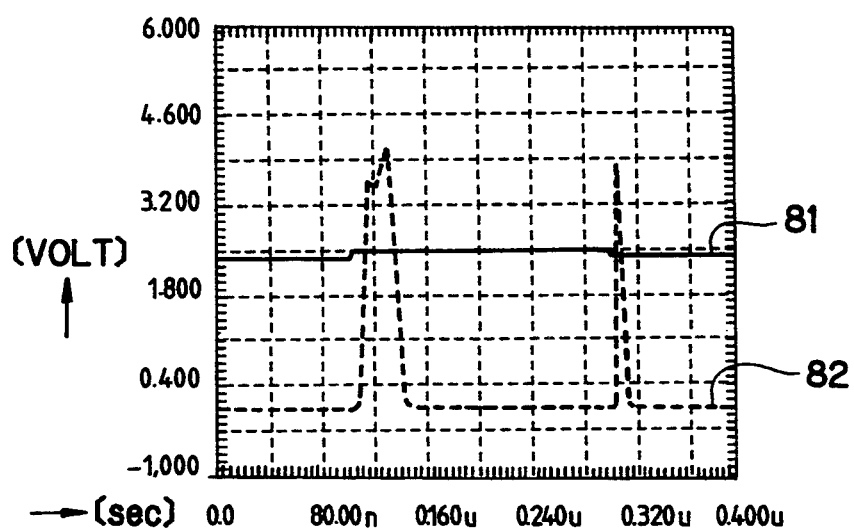
FIG. 8 is a graph of simulation waveform illustrating the relationship between an input voltage and the corresponding trigger pulses in the first embodiment.

The present circuit operation is simulated and its characteristics is shown in FIGS. $M_7$ and 8. Referring to FIG. 7, when a 0.1 $V_{p-p}$ pulse indicated by the reference numeral 71 is applied on the non-inverting input terminal 5, a trigger pulse rises as represented by a waveform 72 and then the output voltage Vo rises as represented by a waveform 73. Compared with the prior art as shown in FIG. 2, the output voltage Vo of the present embodiment rises promptly and sharply. FIG. 8 shows the generated trigger pulses as a waveform 82 when the 0.1 $V_{p-p}$ input pulse as a waveform 81 rises and falls.

Figure 5:
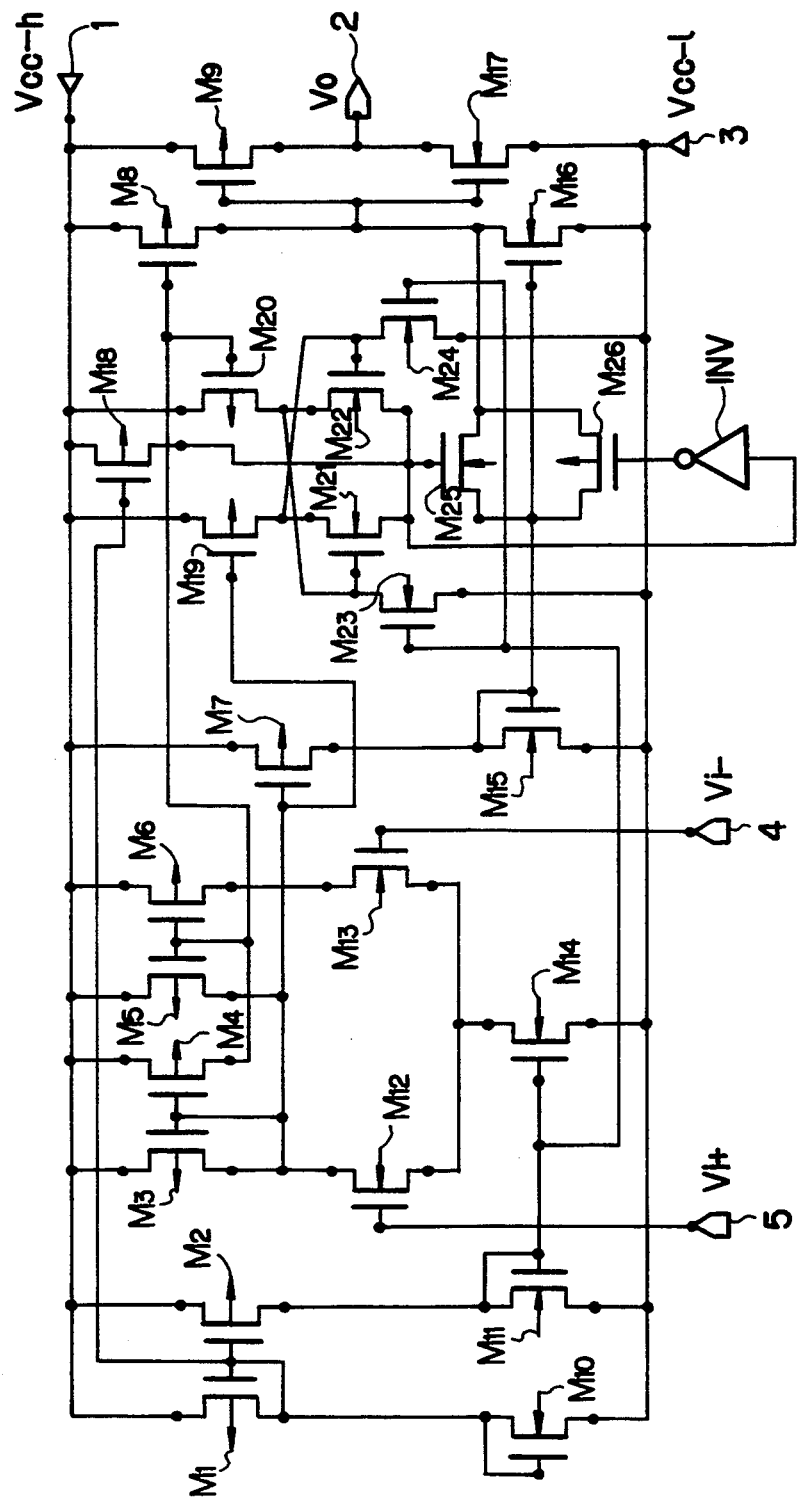
FIG. 5 is a circuit diagram of a second embodiment according to the present invention.

A second embodiment of the present invention is shown in FIG. 5. In this embodiment, the gate circuit for forming a current pass is comprised of a bilateral gate where the n-channel MOS transistor $M_{25}$ is connected to a p-channel MOS transistor $M_{26}$ in parallel with the gates of those transistors connected by an inverter INV. Employing the bilateral gate causes the on-state resistance of the gate circuit to be further reduced, so that higher speed operation can be achieved.

Figure 6:
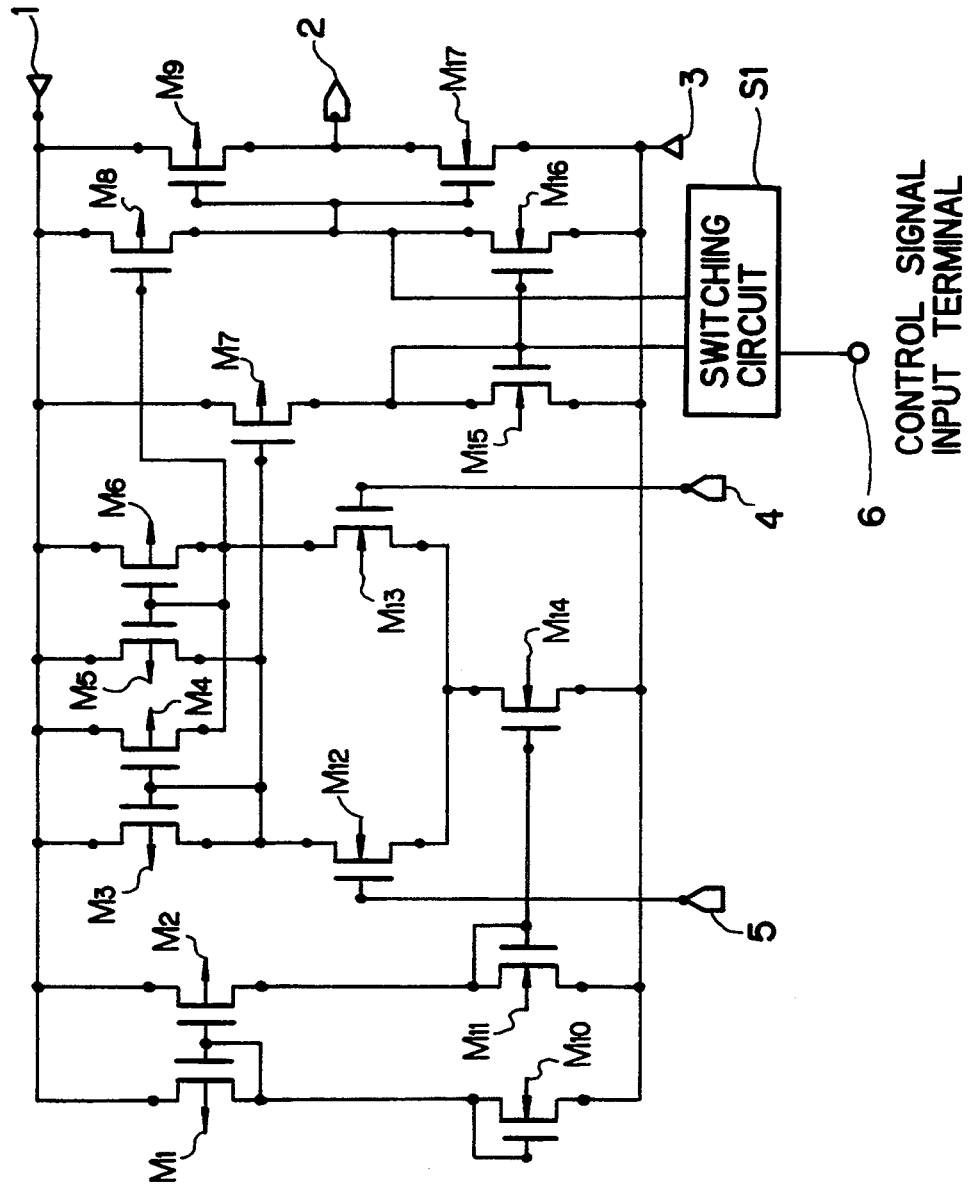
FIG. 6 is a circuit diagram of a third embodiment according to the present invention.

The gate circuit mentioned above may comprise a switching circuit Sl as shown in FIG. 6, which can form the current pass according to a control signal applied on a control signal input terminal 6.

What is claimed is:

1. Voltage comparing circuit for comparing two input signal voltages and outputting a voltage in response to a difference of said two input signal voltages, said voltage comparing circuit comprising:
   a first field effect transistor for receiving one of two signal voltages into a control terminal of said first field effect transistor;
   a second field effect transistor for receiving the other of said two signal voltages into a control terminal of said second field effect transistor, a main terminal of said second field effect transistor providing an output signal of said voltage comparing circuit;
   a third field effect transistor connected to said first field effect transistor in series, said third field effect transistor having a control terminal connected to a main terminal of said third field effect transistor which is connected to said first field effect transistor;
   a fourth field effect transistor connected to said second field effect transistor in series, said fourth field effect transistor having control terminal connected to said control terminal of said third field effect transistor and a main terminal connected to said one main terminal of said second field effect transistor; and
   switch means responsive to the voltage difference between said two signals received by said control terminals of said first and second field effect transistors, respectively, for forming a current pass between a main terminal of said first field effect transistor and said main terminal of said second field effect transistor.

2. Voltage comparing circuit according to claim 1, wherein said switch means comprises:
   means for generating a one-shot trigger pulse in response to a change of said voltage difference between said two input signal voltages; and
   switching means responsive to said oneshot trigger pulse for forming said current pass.

3. Voltage comparing circuit according to claim 2, wherein said switching means comprises a field effect transistor whose gate terminal receives said oneshot trigger pulse.

4. Voltage comparing circuit according to claim 2, wherein said switching means comprises a bilateral gate whose control terminal receives said oneshot trigger pulse.

5. Voltage comparing circuit for comparing two input signal voltages and outputting a voltage in response to a difference of said two input signal voltages, said circuit comprising:
   a differential amplifier which input said two input signal voltages and outputs two voltages having an amplified voltage difference corresponding to said input voltage difference;
   a first field effect transistor for receiving one of said two output voltages from said differential amplifier into a control terminal of said first field effect transistor;
   a second field effect transistor for receiving the other of said two output voltages from said differential amplifier into a control terminal of said second field effect transistor, one main terminal of said second field effect transistor serving as the output terminal of said voltage comparing circuit;
   a third field effect transistor connected to said first field effect transistor in series, said third field effect transistor having a control terminal connected to a main terminal of said third field effect transistor which is connected to said first field effect transistor;
   a fourth field effect transistor connected to said second transistor in series, said fourth transistor having a control terminal connected to the control terminal of said third field effect transistor and a main terminal connected to said one main terminal of said second field effect transistor; and
   switch means responsive to the voltage difference between said two input signals for forming a current pass between a one main terminal of said first field effect transistor and said one main terminal of said second field effect transistor.

6. A voltage comparing circuit as recited in claim 5, wherein said switch means comprises:
   means for generating a oneshot trigger pulse in response to a change of said voltage difference between said two input voltages; and
   switching means responsive to said oneshot trigger pulse for forming said current pass.

7. A voltage comparing circuit as recited in claim 6, wherein said switching means comprises a field effect transistor whose gate terminal receives said oneshot trigger pulse.

8. A voltage comparing circuit as recited in claim 6, wherein said switching means comprises a bilateral gate whose control terminal receives said oneshot trigger pulse.

* * * * *